United States Patent [19]

Conrad et al.

[11] Patent Number: 4,697,096

[45] Date of Patent: Sep. 29, 1987

[54] HIGH VOLTAGE SOLID STATE SWITCH

[75] Inventors: George M. Conrad, Marlboro; Kenneth M. Smalley, Burlington, both of Mass.

[73] Assignee: Raytheon Company, Lexington, Mass.

[21] Appl. No.: 921,836

[22] Filed: Oct. 23, 1986

Related U.S. Application Data

[63] Continuation of Ser. No. 707,931, Mar. 4, 1985, abandoned.

[51] Int. Cl.⁴ .................. H03K 17/56; H03K 3/42; H03K 17/687
[52] U.S. Cl. .................... 307/246; 307/311; 307/571
[58] Field of Search ............... 307/246, 311, 571, 441; 330/297, 310; 323/91; 363/71

[56] References Cited

U.S. PATENT DOCUMENTS

| 3,671,749 | 6/1972 | Harnden, Jr. ............ 307/311 |
| 3,800,164 | 3/1974 | Miller .................... 307/441 |
| 4,495,421 | 1/1985 | Endo et al. .............. 307/311 |

FOREIGN PATENT DOCUMENTS

| 0144645 | 6/1985 | European Pat. Off. |
| 1415391 | 11/1975 | United Kingdom . |
| 1444168 | 7/1976 | United Kingdom . |
| 1465609 | 2/1977 | United Kingdom . |
| 2116742 | 9/1983 | United Kingdom . |

OTHER PUBLICATIONS

"Radar Handbook", Merrill Skolnik, McGraw-Hill Book Company, 1970, Chapter 7, pp. 7-75.
"SCR Manual", 5th Edition, General Electric, Electronics Park, Syracuse, NY 13201, Chapter 6, pp. 159-160 and Chapter 14, p. 437.

Primary Examiner—Stanley D. Miller
Assistant Examiner—B. P. Davis
Attorney, Agent, or Firm—Richard M. Sharkansky; David J. Thibodeau; Allan Lippa

[57] ABSTRACT

A high voltage switching circuit is provided for electrically coupling, or decoupling, a high voltage power supply to, or from, a load selectively in accordance with a control signal. The circuit converts the control signal to a radiant energy signal. A plurality of switching modules serially is coupled between the load and the high voltage power supply, each one of such modules including drive circuitry for converting the radiant energy into drive signals for a switching transistor which drives such transistor between a conducting and non-conducting condition selectively in accordance with the drive signal. With such arrangement, each of the modules develops its own drive signal in response to the radiant energy signal so that each drive signal is self-referenced to the reference potential of the module.

15 Claims, 1 Drawing Figure

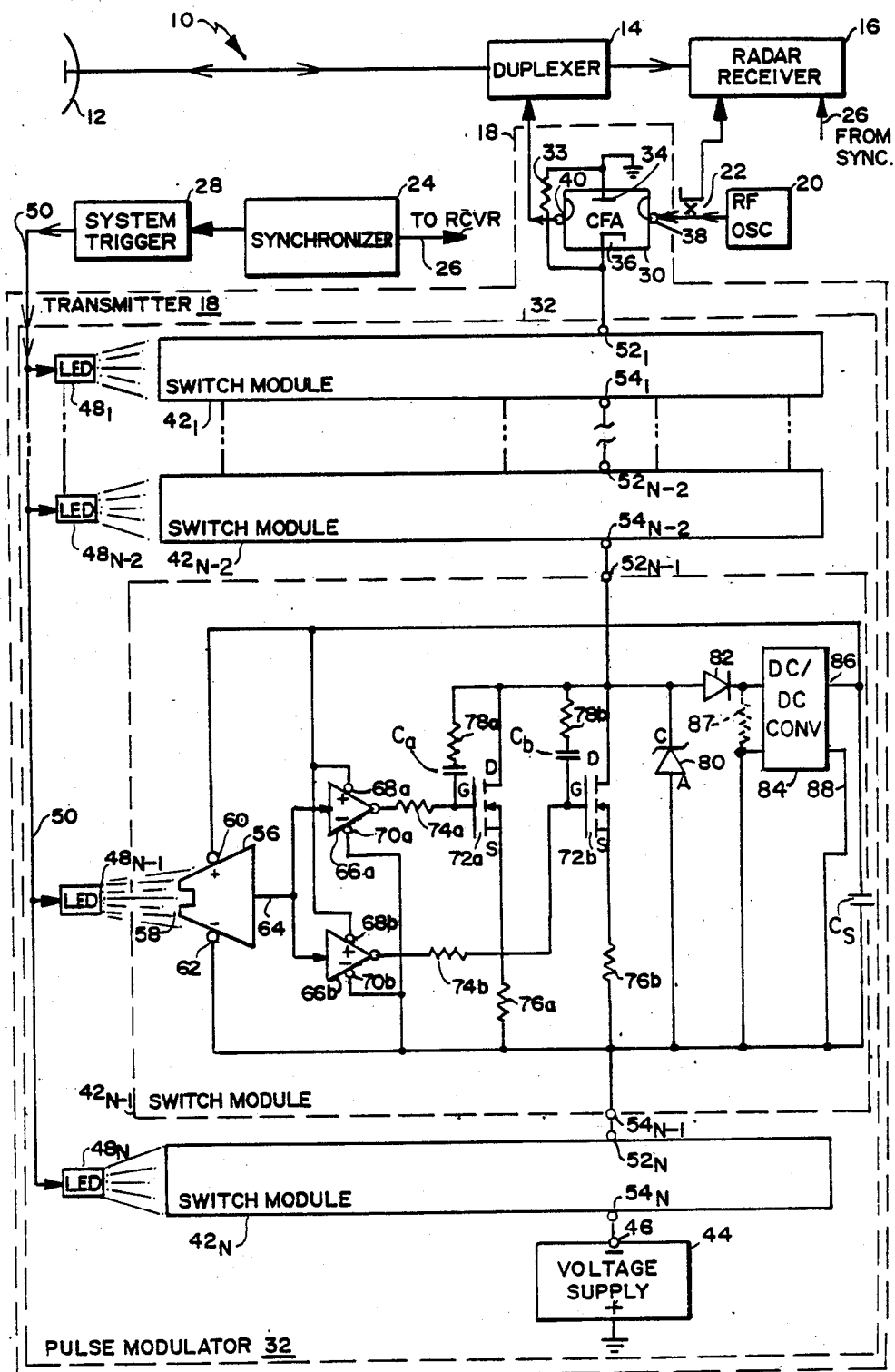

HIGH VOLTAGE SOLID STATE SWITCH

The Government has rights in this invention pursuant to Contract No. N00024-82-C-5110 awarded by the Department of the Navy.

This application is a continuation of application Ser. No. 707,931 filed Mar. 4, 1985, and now abandoned.

BACKGROUND OF THE INVENTION

This invention relates generally to high voltage solid state switches and, more particularly, to switches used as pulse modulators for cathode pulsed tubes used in amplifying radio frequency signals.

As is known in the art, it is sometimes desirable, as in radar transmitters, to produce amplified pulses of radio frequency energy. One such technique includes feeding a pulse modulating signal to a modulator circuit which electrically couples, or decouples, a power supply to or from the cathode-anode of a crossed field tube selectively in accordance with the modulating signal. Such crossed field tube may be a magnetron, a klystron or a crossed field amplifier (CFA) tube. Typically, the modulator circuit includes a high power switch tube with the plate electrode thereof serially connected to the cathode of the radio frequency tube, the anode of the radio frequency tube being grounded, and, the cathode of the switch tube being serially coupled to the negative terminal of a positive grounded high voltage power supply. Thus, radio frequency energy fed to the input port of the radio frequency tube is amplified in the radio frequency tube and is coupled to the output port thereof when the high voltage power supply is electrically coupled to such radio frequency tube by the modulator; conversely, the input radio frequency signal is decoupled from the output port of the radio frequency tube when the modulator electrically decouples the high voltage power supply from the radio frequency tube. In this manner, pulsing the modulator results in pulsed amplified radio frequency (RF) energy at the output terminal of the radio frequency tube; such pulsed RF energy having the same pulse width, duty cycle, and pulse repetition frequency as the modulating signal fed to the pulse modulator.

While such pulse modulator has been found useful in some applications, the switching tube used in such circuit usually has a short operating lifetime when compared to the radio frequency tube, and thus, such switch tube is a significant contributor to transmitter maintenance, material and workload. Further, the heater power required with such switch tube consumes significant prime power and contributes to overall transmitter inefficiency since, inter alia, they require high voltage drops because of high plate resistance, require a number of high voltage supplies for biasing. Still further, the switch tubes are very susceptible to damage in a high shock and vibration environment. Thus, overall, the switch tubes have demonstrated a relatively low mean time between failures (MTBF).

One technique suggested to eliminate the use of the switch tube is to use a solid state device, such as a transistor, in its place. The use of a single transistor, however, is not practical for high voltage applications where the transistor will have developed across it the high voltage of the supply when the transistor is in the non-conducting state. One technique suggested to remove this excessive voltage condition across the transistor is to provide a plurality of serially coupled transistors between the high voltage power supply and the load. With such arrangement, however, the drive signals for each of the transistors must be generally biased to a different relatively high voltage potential. To provide such drive signals typically requires the use of a tapped transformer or series of resistors to provide the properly biased control signal for each of the serially coupled transistors thereby reducing the desirability of such an arrangement because of resonances, time delays, and power loss with the tapped transformer or series of resistors.

SUMMARY OF THE INVENTION

In accordance with the present invention, a high voltage switching circuit is provided for electrically coupling, or decoupling, a high voltage power supply to, or from, a load selectively in accordance with a radiant energy control signal, such circuit comprising: a plurality of switching modules serially coupled between the load and the high voltage power supply, each one of such modules including: means for producing an electrical drive signal in response to detection of the radiant energy control signal; and, a switching transistor for driving such transistor between a conducting and non-conducting condition selectively in accordance with the drive signal, such modules distributing the voltage of the high voltage power supply among the serially coupled modules when the high voltage power supply is decoupled from the load. With such arrangement, because each of the modules develops its own drive signal in response to the radiant energy control signal, each drive signal is self-referenced to the reference potential of the module thereby eliminating the use of tapped transformers or series of resistors.

In accordance with a preferred embodiment of the invention, each one of the switching modules includes: a means, coupled across the transistor, for providing a short circuit in parallel with the transistor when the switching circuit couples the voltage source to the load in the event of a failure in such module; the voltage normally distributed in such failed module from the high voltage power supply being distributed among the non-failed modules. Because of the number of modules used, a failure of one module in N modules increases the voltage previously distributed to that module among the remaining modules, thus insuring proper operation of the transistors in the remaining modules.

In accordance with a preferred embodiment of the invention, the control signal is produced by a light emitting diode and each one of the electrical drive signal producing means includes a fiber optic receiver for receiving light pulses from the light emitting diode.

In accordance with an additional feature of the invention, each one of the modules includes an energy storage means (preferably a capacitor). Such storage means supplies energy when the voltage source is coupled to the load so as to power the electrical drive signal producing means.

BRIEF DESCRIPTION OF THE DRAWING

For a more complete understanding of the concepts of this invention, reference is now made of the following description taken together in conjuction with the accompanying drawing in which the single FIGURE is a schematic diagram of a radar system including a pulse modulator according to the invention.

DESCRIPTION OF THE PREFERRED EMBODIMENT

Referring now to the single FIGURE, a coherent pulsed Doppler radar system 10 has been selected to illustrate how the invention might be applied. Thus, the illustrated radar system 10 includes a radar antenna 12, a duplexer 14, a radar receiver 16, a radar transmitter 18, a radio frequency (R.F.) oscillator 20, a synchronizer 24, and a system trigger 28, all arranged in a conventional manner, as shown, whereby: (a) during transmit modes, synchronizer 24 sends signals to system trigger 28 and in response thereto, radio frequency energy produced by oscillator 20 and coupled to transmitter 18 via conventionl directional coupler 22, is amplified and pulse modulated by such transmitter 18, such amplified and pulse modulated radio frequency energy then being coupled to antenna 12 via duplexer 14 for transmission; and, (b) during interleaved receive modes, portions of the transmitted energy reflected by objects within the beam of the antenna 12, are received by such antenna 12 and are passed via duplexer 14, to the radar receiver 16 where they are heterodyned with signals produced with the signals produced by oscillator 20 into video signals, such video signals then being resolved into range bins in response to signals fed to the receiver 20 from synchronizer 24 via bus 26. It is noted that while the antenna 12, duplexer 14, receiver 16, oscillator 20, synchronizer 24 and system trigger 28 are all of conventional design, the transmitter 18 includes a conventional cathode pulsed radio frequency amplifier tube, here a conventional crossed field amplifier (CFA) 30, controlled by a pulse modulator 32 according to the invention.

As shown, the crossed field amplifier 30 includes an anode 34, coupled to ground as shown, a cathode 36 coupled to the modulator 32, an input port 38 coupled to the oscillator 20 via directional coupler 22, and an output port 40 coupled to the duplexer 14, as shown. A tailbiter resistor 33 is coupled between the anode 34 and cathode 36 in a conventional manner, as shown. The pulse modulator 32 includes a plurality of, here N, identically constructed switch modules $42_1$–$42_N$ (an exemplary one thereof, here switch module $42_{N-1}$ being shown in detail) serially coupled between the cathode 36 of the crossed field amplifier 30 and a high voltage supply 44. Here, the voltage supply 44 is of any conventional design and produces a voltage of magnitude V, the negative potential being at negative terminal 46 and the positive potential being coupled to ground, as shown. Also included in the pulse modulator 32 is a plurality of, N, light emitting diodes $48_1$–$48_N$, the output of each one thereof providing an input for a corresponding one of the switch modules $42_1$–$42_N$, respectively, as shown. The input signal to the light emitting diodes $48_1$–$48_N$ is supplied as a common signal from system trigger 28 via line 50, as shown.

In operation, when an amplified pulse of radio frequency energy is to be transmitted, system trigger 28 pulses "on" the light emitting diodes $48_1$–$48_N$. The pulses of light produced by such diodes $48_1$–$48_N$ are sensed by the switch modules $42_1$–$42_N$, and in response to such sensed light, the switch modules electrically couple the negative terminal 46 of the voltage source 44 to the cathode 36 of the crossed field amplifier 30 to thereby power such amplifier 30 and enable it to amplify the radio frequency energy fed thereto from oscillator 20. Conversely, when the switch modules $42_1$–$42_N$ do not sense light from the diodes $48_1$–$48_N$, the modules $42_1$–$42_N$ electrically decouple the voltage supply 44 from the cathode 36 of the FA 30 and radio frequency energy from oscillator 20 is electrically decoupled from the output port 40 of CFA 30. Thus, each time a pulse of RF energy is to be transmitted, a corresponding pulse of light is produced simultaneously by each of the diodes $48_1$–$48_N$ and, in response thereto, each one of the modules $42_1$–$42_N$ operates electrically to replicate the light emitted pulse and such modules $42_1$–$42_N$ thus operate simultaneously to pulse modulate the operation of CFA 30.

Considering now the details of an exemplary one of the switch modules $42_1$–$42_N$, here switch module $42_{N-1}$, it is first noted that such module $42_{N-1}$ has a pair of output terminals $52_{N-1}$, $54_{N-1}$ and that the output terminal $52_{N-1}$ is connected to the output terminal $54_{N-2}$ of module $42_{N-2}$ (i.e. the modules directly serially connected thereto) and the output terminal $54_{N-1}$ of module $42_{N-1}$ is connected to the output terminal $52_N$ of module $42_N$ (i.e. the other one of the modules directly connected thereto). Next, it is noted that output terminal $52_1$ of the first one (i.e. module $42_1$) of the N serially connected modules $42_1$–$42_N$ is connected to the cathode 36 of CFA 30 and that the output terminal $54_N$ of the last one (i.e. module $42_N$) of the N serially coupled modules $42_1$–$42_N$ is connected to the negative terminal 46 of the voltage supply 44, as shown. As will become evident hereinafter, when the modules $42_1$–$42_N$ detect light emitted by the diodes $48_1$–$48_N$, the output terminals $52_1$, $54_1$ to $52_N$, $54_N$ of such modules $42_1$ to $42_N$ become electrically coupled together (coupled through a relatively low impedance) whereas in the absence of such detected light, the output terminals $52_1$, $54_1$ to $52_N$, $54_N$ of such modules $42_1$ to $42_N$ become electrically decoupled (more accrately, coupled through a very high impedance which is substantially an open-circuit).

Thus, considering module $42_{N-1}$, it is first noted that module $42_{N-1}$ includes a conventional fiber optic receiver, hereinafter referred to as optoreceiver 56. Here, optoreceiver 56 is model HFBR 2202 sold by Hewlett Packard, Palo Alto, Calif. Optoreceiver 56 has its input 58 aligned to receive light from light emitting diode $48_{N-1}$ and is powered by a voltage (here 10 volts) coupled across terminals 60, 62 in a manner to be described. Suffice it to say here, however, that when a suitable voltage is applied across terminals 60, 62, a negative going electrical pulse is produced by optoreceiver 56 on line 64 when such receiver 56 senses a pulse of light emitted by diode $48_{N-1}$. The electrical signal on line 64 thus is referenced to the potential at terminal 62 so that in the absence of a pulse of light, the signal on line 64 is at a high positive relative to the potential at terminal 62 and in the presence of a light pulse, the signal on line 64 goes negative i.e., to a potential near the potential at terminal 62. The signal on line 64 is coupled in parallel to a pair of identical inverting drive amplifiers, here amplifiers 66a, 66b. The inverters 66a, 66b are powered by a voltage coupled across terminals 68a, 70a for inverter 66a and across terminals 68b, 70b for inverter 66b. The inverters thus invert the negative going pulse produced by the optoreceiver 56 in response to the pulse of light by LED $48_{N-1}$ into a positive going pulse. It is noted that the signals produced out of inverters 66a, 66b are referenced to the voltage at terminals 70a, 70b and thus in response to the negative going pulse on line 64 go from a reference potential near the potential at terminals 70a, 70b to a potential more positive, that is near the potential at terminals 68a, 68b. The positive going pulses that are produced by each of the inverters 66a, 66b are coupled as drive signals to the gate electrodes (G) of a pair of n-channel, enhancement mode, metal oxide semiconductor (MOS) field effect transistors (FET's) 72a, 72b, respectively, via resistors 74a, 74b, respectively, as shown. Thus, the swing in voltage of the control signal fed to the gate electrodes G is $\Delta V$ independent of the voltage at terminal $54_{N-1}$. The source electrodes (S) (and substrates) of the FET's 72a, 72b are coupled to the output terminal $54_{N-1}$ via resistors 76a, 76b, as shown, and the drain electrodes (D) of the FET's 72a, 72b are coupled to the output terminal $52_{N-1}$.

It is also noted that the gate, or control, electrodes (G) of the FET's 72a, 72b are also connected to the output terminal $52_{N-1}$ via resistors 78a, 78b, and capacitors $C_a$, $C_b$, as shown. A zener diode 80 has its anode electrode (A) connected to output terminal $54_{N-1}$ and its cathode electrode (C) connected to output terminal $52_{N-1}$ Diode 82 has its anode eletrode connected to output terminal $52_{N-1}$ and its cathode electrode connected to the input of a conventional DC to DC converter 84. The output voltage produced across terminals 86, 88 of the DC to DC converter 84 is coupled across terminals 60, 62 of the optoreceiver 56, across terminals 68a, 70a of inverter 66a, and across terminals 68b, 70b of inverter 66b. Completing the module $42_{N-1}$ is a storage capacitor $C_s$ coupled across terminals 86, 88 of the DC to DC converter 84, as shown.

In operation, when a pulse of light is produced by each of the LED's $48_1$–$48_N$, a corresponding negative going pulse is produced by the optoreceiver 56 on line 64. Such negative pulse is converted to a corresponding positive going pulse by the pair of inverters 66a, 66b. The positive going pulse produced by the inverters 66a, 66b drives the FET's 72a, 72b to a conducting state (i.e., a relatively low resistance is produced between the source (S) and drain (D) electrodes). It is noted that the drive voltages produced by inverters 66a, 66b are self-referenced to the potential at terminal $54_{N-1}$. The drive voltage into the gate electrodes (G) of the FET's 72a, 72b (i.e., the voltage at the gate (G) relative to the voltage at terminal $42_{N-1}$) is regulated (in a manner to be described) here to within 10 mV, in order to generate a constant current, here 12 amps, through each one of the pair of transistors 72a, 72b, which is desired to supply 24 amps for proper operation of the CFA 30. Here, the CFA 30 requires 14,000 volts and 24 amps to provide amplification of the radio frequency signal fed to input port 38 thereof. Because each module must pass 24 amps, a pair of parallel connected FET's 72a, 72b are used in each module, each FET carrying only 12 amps. Here, voltage supply 44 is an 18,000 volt supply. Thus, 4,000 volts is dropped across the plurality of modules $42_1$–$42_N$. Here, N is eighty so that 50 volts is dropped across each one of the eighty modules $42_1$–$42_N$. It is also noted that the terminals $54_1$–$54_N$ of each of the eighty modules $42_1$–$42_N$ is at different potential $V_{54n}$, given by $V_{54}(n) = -18,000 + 50(N-n)$ where N=80 and n is the number (i.e., subscript) of the module. Thus, for module $42_{N-1}$ (i.e. here $n = N-1$) the potential at terminals 54 $N-1$ is $V_{54(N-1)} = -18,000 + 50(N-(N-1)) = -17,950$ volts. As is noted above, however, the pulses produced by optoreceiver 56 and inverters 66a, 66b are referenced to $V_{54(N-1)}$ and also the source (S) of FET's 72a, 72b are referenced to the voltage $V_{54(N-1)}$. Thus, considering exemplary module $42_{N-1}$, 50 volts is present between terminals $52_{N-1}$, $54_{N-1}$ with terminal $52_{N-1}$ being at a positive potential relative to the potential at terminal $54_{N-1}$ When the positive going pulses produced by the inverters 66a, 66b are removed, the FET's 72a, 72b are placed in a non-conductng state (i.e. a high resistance is produced between the source (S) and drain (D) electrodes of the FET's 72a, 72b) to effectively electrically decouple the voltage source 44 from the CFA 30. It is noted, however, that because of the capacitance between the anode and cathode electrodes 34, 36 of the CFA, such electrodes initially store 14,000 volts when the CFA is removed from supply 44. This stored 14,000 volts is discharged through the tailbiter resistor 33 (here 20K ohms) with the result that cathode 36 of the CFA 30 is at, initially, a negative 14,000 volt potential relative to ground and discharges in a short time. Thus, the full 18,000 volts potential of the supply 44 appears across the eighty modules $42_1$–$42_N$. It is first noted that the effective resistance across a module (i.e., as across terminals $52_{N-1}$, $54_{n-1}$ of module $42_{N-1}$) when such module is in the non-conducting state may be considered as substantially equal to the input impedance of the DC/DC converter 86, represented in the FIGURE by a phantom resistor 87 connected between the cathode of diode 82 and terminal $54_{N-1}$ for module $42_{N-1}$ Since the input impedance 87 of DC/DC converter 84 is here approximately 50K ohms when the modules are non-conducting, the total resistance between cathode 36 of CFA 30 and terminal 46 of supply 44 is here approximately 4 meg ohms when the modules $42_1$–$42_N$ are non-conducting. Thus, such total 4 meg ohms resistance is 200 times larger than the 20K ohms resistance of the tailbiter resistor 33, so that substantially all of the 18,000 volts of the supply 44 is, therefore, distributed, here equally among the eighty modules $40_1$–$40_N$ with the result that each module has a 250 volt potential between terminals $52_N$, $54_N$ thereof; the potential at terminal $52_N$ being more positive than the potential at terminal $54_N$. Thus, here again, each of the modules is at a different reference potential. That is, the voltage at terminal $V54_n$ may now be represented as $V54_{(n)} = -18,000 + 250(N-n)$ so that the voltage of terminal $54_{N-1}$, $V54_{N-1}$) now $-18,000 + 250(N-(N-1)) = -17,750$ volts. However, each of the elements 56, 68a, 68b, 72a, 72b, 80, 84 in the module is referenced to the potential at terminal $54_{N-1}$. Thus, the 250 volt potential at terminal $52_{N-1}$ thus forward biases diode 82 and such 250 volt potential is thus electrically coupled to the DC to DC converter 84. The DC to DC converter 84 converts the 250 volt potential fed thereto to, here, 10 volts; relative to the voltage at terminal $54_{N-1}$. Such 10 volts is coupled to terminals 60, 68a, 68b to thereby power the optoreceiver 56 and the inverters 66a, 66b. It is also noted that storage capacitor $C_s$ charges to 10 volts relative to terminal $54^{N-1}$; thus, when the FET's 72a, 72b of modules $42_1$–$42_N$ are conducting, as when the supply 44 is electrically coupled to the CFA 30, diode 82 is back-biased and the 10 volt voltage stored in capacitor $C_s$ is coupled to terminals 60, 68a, 68b to thereby provide the energy to power the active circuits (i.e., the optoreceiver 56 and the inverters 66a, 66b). Resistors 76a, 76b provide stability against transconductance variations in the transistors 72a, 72b thereby allowing proper current sharing between such transistors. Resistors 78a, 78b in conjunction with series resistors 74a, 74b provide the feedback required to make the the modules have a low dynamic impedance which is required to maintain an even distribution of voltage among the modules.

Considering next the effect of a failure in one of the modules $42_1$–$42_N$, as for example, a failure in the one of the LED's $48_1$–$48_N$, which drives the module, a failure in the optoreceiver 56 of such one of the modules, or a failure in the DC to DC converter 84, when the CFA 30 is driven "on" (i.e., coupled to supply 44), the zener diode 80 of such failed module breaks down and short circuits and conducts the requisite current from supply 44 to the CFA 30 and thereby prevents a failure of the entire pulse modulator 32. It is noted, however, that the 250 volts to be dropped across the failed module is now distributed to the remaining ones of the modules, here the remaining 79 modules, with the result that such rmaining modules have dropped across them 250 volts plus (250/79) volts; the added (250/79) volts being only a small fraction of the normal 250 volts for which the transistors in the modules were nominally designed to operate. The zener diode 80 also is used to limit the voltage across the module to, here, 300 volts, in event of arcs in the CFA 30 causing voltage surges throughout the pulse modulator 32 due to unavoidable series inductance in the wire interconnecting the modules $42_1$–$42_N$ and connecting the modules to the CFA 30.

As noted above, it is desired to regulate the voltage at the gate electrodes of the FET's 72a, 72b. This is accomplished through capacitors $C_a$, $C_b$. It is first noted that when the modules are in a non-conducting mode, there is 250 volts across the terminals $52_1$, $54_1$ to $52_N$, $54_N$. Thus, there is 250 volts across $52_{N-1}$, $54_{N-1}$ of exemplary module $42_{N-1}$. The capacitors $C_a$, $C_b$ serve as d.c. blocking capacitors during this condition and thereby prevent power loss in resistors 74a, 74b, respectively. It is noted, however, that capacitors $C_a$, $C_b$ thus charge during the non-conducting condition. As noted above, during the conducting mode, storage capacitor $C_s$ provides power to optoreceiver 56 and inverters 66a, 66b. As the energy is depleted from the storage capacitor $C_s$, however, the voltage of the gates (G) of FET's 72a, 72b would absent capacitors $C_a$, $C_b$ tend to "drop". Capacitors $C_a$, $C_b$ tend to reduce the "drop" by discharging through the drain-source electrodes of FET's 72a, 72b through resistors 76a, 76b through storage capacitor $C_s$, through the terminals 68a, 68b of inverters 66a, 66b and through resistors 74a, 74b. It is noted that the discharge current from capacitors $C_a$, $C_b$ in passing through resistors 74a, 74b produce a voltage across such resistors 74a, 74b that is more positive at the outputs of inverters 66a, 66b than at the gates of FET's 72a, 72b. Thus, as the capacitors $C_a$, $C_b$ discharge, the discharge current produced by such capacitors $C_a$, $C_b$ also decreases and the voltages at the gates G increase positively. By making $(C_s 2) \cdot R_{74a} = R_{78a} \cdot C_a = R_{78b} \cdot C_b$ where: $C_s$ is the capacitance of capacitor $C_s$; $R_{74a}$ the resistance of resistor 74a; $R_{74b}$ the resistance of resistor 74b; $C_a$ the capacitance of capacitor $C_a$; and, $C_b$ the capacitance of capacitor $C_b$; the positive increase in the voltage at the gates G of FET's 72a, 72b from the discharge of capacitors $C_a$, $C_b$, will balance the drop in voltage at the gates G from the discharge of capacitor $C_s$ so that the resultant voltage at the gates G will be substantially constant during the conducting mode of the module.

Having described a preferred embodiment of the invention, it is now evident that other embodiments incorporating these concepts may be used. It is felt, therefore, that this invention should not be restricted to the disclosed embodiment but rather should be limited only by the spirit and scope of the appended claims.

What is claimed is:

1. A switching circuit for electrically coupling, or decoupling, a voltage supply to, or from, a load selectively in accordance with an electrical control signal, such circuit comprising:
   (a) means for converting the electrical control signal into a radiant energy signal; and,
   (b) a plurality of switching modules serially coupled between the load and the voltage supply, each one of the modules being at a different reference potential, each one of such modules including: a switching transistor; means, responsive to the radiant energy signal, for providing a drive voltage to drive such transistor into either a conducting or a non-conducting condition selectively in accordance with the radiant energy; energy storing means, such energy storing means being coupled to the voltage supply for storing energy therein when such voltage source is decoupled from the load, such storing means applying power to such drive voltage providing means when the voltage supply is coupled to the load; and means, coupled to such transistor, for regulating such drive voltage to a substantially constant predetermined voltage with respect to the reference potential of such module to maintain a substantially constant current from such voltage source through each of such transistors to such load during the conducting condition of such transistor.

2. The switching circuit recited in claim 1 wherein each one of such modules includes means, coupled across the transistor, for providing a short circuit in parallel with the transistor when the switching circuit couples the voltage source to the load in the event of a failure in such module with the voltage normally distributed to such failed module being distributed among the remaining non-failed modules.

3. The circuit recited in claim 1 wherein such drive voltage providing means includes active circuitry, coupled to the transistor.

4. The circuit recited in claim 3 wherein one of the modules includes a voltage converter coupled between the voltage supply and the storing means.

5. A switching circuit for electrically coupling, or decoupling, a voltage supply to, or from, a load selectively in accordance with a control signal, such switching circuit comprising:
   (a) means for converting the control signal into a radiant energy signal;
   (b) a plurality of switching modules, each one thereof being at a different reference potential, each one of such modules comprising:
      (i) a transistor having a control electrode and a pair of output electrodes;
      (ii) drive circuit means, responsive to the radiant energy control signal, for converting such radiant control signal into a corresponding drive voltage, such drive circuit means feeding the drive voltage to the control electrode of the transistor to drive the transistor selectively into either a conducting condition or a non-conducting condition between the pair of electrodes of the transistor, selectively in accordance with the drive voltage;
      (iii) an energy storage circuit;

(iv) means for coupling the voltage source to the energy storage circuit when the voltage source is decoupled from the load to charge such energy storage circuit and for coupling the energy storage circuit to the drive circuit means to provide energy to such drive circuit means when the voltage source is coupled to the load; and (v) means for regulating such drive voltage with respect to the reference potential of such module to maintain a substantially constant drive voltage to compensate for the discharge of such storage circuit during the conducting condition of such tranistor, such constant drive voltage providing a substantially constant current from the voltage source through each of such transistors to the load during the conducting condition of such transistor;

(c) means for coupling the pair of output electrodes of the plurality of modules serially between the source and the load.

6. The circuit recited in claim 5 including a voltage converter coupled between the voltage supply and the sotrage circuit.

7. The circuit recited in claim 6 wherein the transistor is a field effect transistor, the control electrode being the gate electrode and the output electrodes being the source and drain electrodes.

8. The circuit recited in claim 7 including a resistor and wherein the drive circuit means feeds the drive voltage to the gate electrode through a resistor.

9. The circuit recited in claim 5 including a zener diode coupled in parallel with the pair of output electrodes and the drive circuit means.

10. The circuit recited in claim 5 wherein the drive circuit means includes active circuitry coupled to the transistor.

11. The circuit recited in claim 10 wherein the active drive circuitry compises an optoelectric system.

12. A switching circuit for electrically coupling, or decoupling, a voltage supply to, or from, a load selectively in accordance with an electrical control signal, such switching circuit comprising:

(a) means for converting the control signal into a radiant energy signal; and (b) a plurality of switching modules, each one thereof comprising:

(i) a field effect transistor having a gate electrode, a drain electrode and a source electrode;

(ii) a first resistor electrically coupled to the gate electrode;

(iii) drive circuit means, responsive to the radiant energy control signal, for converting such radiant control signal into a corresponding drive signal, such drive circuit means feeding the drive signal through the first resistor to the gate electrode of the transistor to drive the transistor selectively into either a conducting condition or a non-conducting condition between the drain and source electrodes of the transistor, selectively in accordance with the drive signal;

(iv) means for serially coupling the drain electrode and the source electrode of respective transistors between the voltage source and the load;

(v) a storage capacitor;

(vi) means for coupling the voltage source to the storage capacitor when the voltage source is decoupled from the load to charge such capacitor and for coupling the storage capacitor to the drive circuit means to provide energy to such drive circuit means when the voltage source is coupled to the load; and (vii) a second resistor and a capacitor serially coupled betwween the gate electrode and the drain electrode.

13. The circuit recited in claim 12 wherein the product of the capacitance of the storage capacitor and the resistance of the first mentioned resistor is substantially proportional to the product of the serially coupled capacitor and the resistance of the serially coupled resistor.

14. The circuit recited in claim 13 including a zener diode coupled in parallel with the source and drain electrodes and the drive circuit means.

15. The circuit recited in claim 14 including a voltage converter coupled between the transistor and the storage capacitor.

* * * * *